United States Patent
Neuman (10) Patent No.: US 6,384,339 B1
(45) Date of Patent: May 7, 2002

(54) PRINTED CIRCUIT BOARD ASSEMBLY HAVING ADHESIVE JOINT

(75) Inventor: David Neuman, Randolph, MN (US)

(73) Assignee: Sheldahl, Inc., Northfield, MN (US)

( * ) Notice: Subject to any disclaimer, the term of this patent is extended or adjusted under 35 U.S.C. 154(b) by 0 days.

(21) Appl. No.: 09/804,132

(22) Filed: Mar. 12, 2001

Related U.S. Application Data (62) Division of application No. 09/070,505, filed on Apr. 30, 1998, now Pat. No. 6,226,862.

(51) Int. Cl.$^7$ ................................................. H05K 1/00
(52) U.S. Cl. ........................ 174/254; 361/749; 174/259
(58) Field of Search ................................ 174/254, 259, 174/261, 255; 361/749–751

(56) References Cited

U.S. PATENT DOCUMENTS

| | | |
|---|---|---|
| 2,803,731 A | 8/1957 | Coburn |
| 3,374,531 A | 3/1968 | Bruce |
| 3,764,436 A * | 10/1973 | Schmidt et al. ............. 156/288 |
| 4,113,981 A | 9/1978 | Fujita et al. |
| 4,702,785 A | 10/1987 | Burger |
| 4,872,934 A | 10/1989 | Kameda |
| 4,983,804 A | 1/1991 | Chan et al. |
| 5,059,756 A | 10/1991 | Henschenp et al. |
| 5,093,545 A | 3/1992 | McGaffigan |
| 5,179,777 A | 1/1993 | Suzuki |

(List continued on next page.)

FOREIGN PATENT DOCUMENTS

| | | |
|---|---|---|
| JP | 2-268381 | 9/1994 |
| JP | 6-260755 | 9/1994 |
| JP | 6-268354 | 9/1994 |
| JP | 6-275959 | 9/1994 |

OTHER PUBLICATIONS

"System Speeds Compliance with MIL–STD–2000", Charles W. Sorbet, Jr., *Microwaves & RF*, vol. 32, No. 5 (May 1993), pp. 187–188, 191.

"Package Technology for STM–16 Optical Tx/Rx and IC's", A. Takai et al., 1991 Proceedings: 41st Electronic Components & Technology Conference (May 11–16, 1991), pp. 141–146.

"IR Controlled Induction Soldering of Microwave Cable Assemblies", B. Ables et al., *Connection Technology*, vol. 6, No. 2 (Feb. 1990), pp. 22–26.

"Induction Soldering in the Electric–Equipment Industry", V. V. Asamov et al., *Soviet Elect. Eng.*, vol. 52, No. 7 (1981), pp. 95–98.

"Latest Applications of Infrared Techniques for Industrial Process Control", R. Vanzetti, 1971 Sixth Annual Meeting of the IEEE Industry and General Applications Group (Jan. 1971), pp. 973985.

*Primary Examiner*—Kamand Cureo
*Assistant Examiner*—Jeremy Norris
(74) *Attorney, Agent, or Firm*—Merchant & Gould P.C.

(57) ABSTRACT

A new process for electrically and mechanically joining arrays of conductors on flexible printed circuits and other flexible conductors including collated flat, flexible cables (FFCs). An array of flat copper conductors on a flexible dielectric sheet is electroplated with tin-lead solder. Surface insulation is locally omitted or removed from conductor surfaces. A second circuit or cable is overlapped in competent electrical communication and the solder plating fused by inductively heating the copper to join the two conductor arrays. An adhesive placed between conductors is also thermally activated to bond the film on the two cable arrays together. This insulates the electrical connections and seals them from attack by moisture and chemical pollutants.

14 Claims, 4 Drawing Sheets

U.S. PATENT DOCUMENTS

| | | |
|---|---|---|
| 5,183,969 A | 2/1993 | Odashima |
| 5,203,075 A | 4/1993 | Angulas et al. |
| 5,235,741 A | 8/1993 | Mase |
| 5,288,959 A | 2/1994 | Henschen |
| 5,357,084 A | 10/1994 | McKee et al. |
| 5,452,182 A * | 9/1995 | Eichelberger et al. ...... 361/749 |
| 5,590,460 A | 1/1997 | Distefano et al. |
| 5,590,465 A * | 1/1997 | Santo .......................... 29/884 |
| 5,799,392 A | 9/1998 | Mishiro |
| 5,873,161 A | 2/1999 | Chen et al. |
| 6,093,894 A * | 7/2000 | Carlson et al. .......... 174/117 F |
| 6,229,100 B1 * | 5/2001 | Fjelstad ...................... 174/261 |
| 6,274,225 B1 * | 8/2001 | Miyake et al. .............. 428/209 |

* cited by examiner

PRINTED CIRCUIT BOARD ASSEMBLY HAVING ADHESIVE JOINT

This application is a divisional of application Ser. No. 09/070,505, filed Apr. 30, 1998, now U.S. Pat. No. 6,226,862 which application(s) are incorporated herein by reference.

FIELD OF THE INVENTION

The present invention is generally related to a method for electrically interconnecting a first plurality of contact elements in an array of elements on a first electrical article to a second plurality of contact elements in an array of elements on a second electrical article. The invention specifically relates to electrically interconnecting contact elements on a flexible film circuit or on a rigid printed circuit board with a flat, flexible cable or flexible film circuit and is further directed to the resulting apparatus and to methods of manufacture.

BACKGROUND OF THE INVENTION

Flexible printed circuit boards and flexible cables constructed from polymeric film, (e.g.) polyester or polyimide film, substrates are generally known in the art. Such films are lightweight, flexible and thin. Varying circuit shapes, dimensions, circuit arrangements and different length cable arrangements may be constructed using polyester. However, a disadvantage to the use of polyester is its relatively low tolerance to heat. Lap joints have been formed using a hot bar to cause solder reflow on polyimide substrates, but using a similar process with a polyester substrate could burn or melt polyester. Unfortunately, polyimides are substantially more expensive than polyesters.

When electrical connection was desired between printed circuit boards, cables were often used having a sufficient number of wire leads to connect the bond pads on one circuit to another circuit. Such electrical connections were most commonly made by inserting the cable structure into a mechanical plug-in formed on the edge of one circuit. Such plug-ins provided excellent electrical and mechanical bonding. However, they were expensive to make and difficult to install during assembly. The plug-in type edge bonding connectors replaced complex point-to-point connections using discrete copper wires.

Flexible circuit boards have been joined electrically (and physically) either by sing anisotropic adhesives (which are electrically conductive in the vertical or z-direction, but are substantially electrically insulating in the horizontal x, y, or x-y plane) or by physically crimping the boards together. Unfortunately, adhesives require a relatively large surface area to ensure adequate conductivity. In addition, mechanical crimps can be prone to failure and have limited conductivity.

Conventional circuit board assemblies and methods of their construction do not appear to provide an economical and reliable solution to interconnection and construction challenges. Therefore, a printed circuit board assembly comprising a flexible circuit member and method for connecting a printed circuit board to such a flexible member that addresses the above-identified deficiencies is a demonstrable goal in this art.

SUMMARY OF THE INVENTION

The invention involves a new process for electrically and mechanically joining arrays of conductors on rigid or flexible printed circuits with corresponding conductors on a second flexible circuit board or to a collated flat, flexible cable (FFC). Corresponding bonding areas are overlapped. In the bonding area mated pads or conductor surfaces with a solder layer are contacted. The overlapped bonding areas are inductively heated under pressure to mechanically and electrically bond the areas. Adhesive surrounding the conductors is thermally activated to bond the circuit boards together.

In the process a flexible member comprising an array of flat copper conductors formed on a flexible film comprising a dielectric sheet is electroplated with tin-lead solder. Surface insulation or solder masks are locally omitted or removed from conductor surfaces. The conductors on the circuits or cables are overlapped onto the corresponding conductors and the solder plating is fused by inductively heating the copper to join the two conductor arrays in a discrete bonding area. Adhesive on the dielectric film between conductors is thermally activated to bond the film on the two cable arrays together. This insulates the newly formed electrical connections and seals them in a bonding area from attack by moisture and chemical pollutants in the production or use environment.

There are several advantages over present technology. The solder and adhesive can act alone to electrically and mechanically connect the members. The conductor arrays on flexible circuits and on FFCs can be joined without adding additional materials for electrically and mechanically connecting, insulating and sealing the connections. The process of the invention can be used on flex circuits and cables having low temperature substrate or insulation (PET polyester film, for example), unlike conventional soldering methods which require heat resistant insulation or substrate (like polyimide film, for example). In addition, this process can be used in place of conventional metal-plastic plug-like connector devices to give joinable connections for electronic modules which are interconnected by flex circuits and FFCs. The inductively heated joint according to this invention does not limit the current carrying capability of the interconnect beyond that of the current capability of the conductors, whereas conventional mechanical crimps may limit the current carrying capability at the interconnect.

The invention is directed to a preferred assembly of electrically connected printed circuit boards which comprises a first flexible printed circuit board including a substrate and an electrically conductive layer comprising a plurality of conductive leads or traces bonded to the substrate pads, and having a first plurality of solder—covered electrically conductive leads or traces disposed on the substrate with adhesive present between the pads or leads; a second flexible printed circuit board including a substrate and an electrically conductive layer bonded to the substrate with insulating adhesive, and having a second plurality of solder covered electrically conductive leads disposed on the substrate with adhesive present between the leads; and wherein the first plurality of leads are mechanically and electrically connected to the second plurality of leads. The adhesive between the first plurality of leads is bonded to the adhesive between the second plurality of leads, thereby insulating the electrically connected leads one from another.

The invention is further directed to a method for connecting a first printed circuit board to a second printed circuit board, each of the boards having corresponding or mated, solder covered copper leads or connector pads disposed on the circuit board and adhesive disposed between the leads or pads. The method comprises the steps of contacting the leads of the first board with mated leads of the second board;

inductively soldering the leads of the first board to the leads of the second board to establish an electrical connection; and bonding the adhesive disposed between the leads of the first board to the adhesive disposed between the leads of the second board, thereby sealing adjacent pairs of mated leads one from another.

DETAILED DESCRIPTION

Substrate

The flexible printed circuit boards of the invention, the flat cables of the invention, and any other substrate containing an array of conductive circuit paths or traces can be made on a flexible substrate. Flexible substrates can be typically thin film organic polymeric materials. A variety of polymers can be used to form the thin film substrates. Both vinyl and condensation polymers are useful. Vinyl polymers that can be considered include polyethylene, polypropylene, polystyrene, polyvinyl chloride, polyacrylates and others. Condensation polymers include a variety of materials most commonly polyester, polyimide, polyetheretherketones, etc. Polyimide materials are often used in applications requiring a significant heat history or range of heat parameters because of the heat stability of the polyimides.

The presently claimed invention is directed to the possible use of polyester substrates to replace the polyimide substrates used previously. While the invention can make use of polyimides, a preferred embodiment uses less expensive polyesters instead. It can be noted that polyesters and polyimides are similar in such characteristics as mechanical strength. This is evidenced by their similar values for tensile strength and flexible modulus (Young's modulus) at room temperature.

Preferred Polyester

In general, polyester includes any heterochain macromolecular substance which contains carboxylate ester groups as the repeating groups in its main chain. However, the most commonly used polyester is PET or PEN, poly(ethylene-co-terephthalate) or poly(ethylene-co-naphthalate). While PET shares many of the mechanical characteristics of polyimides, it has the advantage of being substantially less expensive. Unfortunately, it is much less resistant to heat. The preferred embodiment of this invention uses circuit grade polyester wherein the polyester substrate is typically 25 to 175 microns thick.

Polyimide

In general, polyimides are condensation polymers which are derived from bifunctional carboxylic acid anhydrides and primary diamines. Although the apparatus and method of one embodiment of this invention may use polyimides, the cost differential between polyester and polyimides would make the use of a polyester substrate more advantageous.

Conductor

Copper is the preferred conductor for use in the presently claimed invention. However, other materials could also be used. The copper layer is typically 20 to 200 microns thick.

Solder

The present invention preferably uses eutectic solder which has a tin to lead ratio of 63 to 37. Low temperature solders could be used, but they have less mechanical strength at operating temperatures.

In the method of the invention, the ends of the conducting leads are precoated in solder prior to the inductive soldering step. This is typically accomplished by conventional plating or melt solder formation.

Adhesive

Adhesives are used to bond the two laminate surfaces together. In addition, the adhesive serves to seal the solder joints and protect them from moisture and from chemical pollutants. This is advantageous in that no additional material needs to be used to accomplish this. Suitable adhesives for use in the present invention include thermoplastic adhesives known in the art for making flexible cables and flexible circuits. The adhesive is typically 10 to 75 microns thick.

Induction Soldering

Induction soldering is a process whereby RF frequencies are used to induce eddy currents in copper conductors. These eddy currents are sufficient to generate enough heat within the copper conductor to melt the preapplied solder on the lead end. An advantage to this method is that only the leads that fall under the induction loop heat, substantially reducing the amount of heat which is transferred to the substrate.

Operating parameters include the distance of the inductor from the joint area, the RF power, heating time to solder and clamping pressure.

The flexible circuits joined in the process of the invention can be made by first obtaining a flexible substrate preferably a polyester film. Upon the film is laminated a copper foil resulting in a copper layer that is securely bonded to the film by the thermoplastic adhesive. The copper layer resists removal forces resulting from process dynamics and environmental heat and humidity. The copper layer can be masked and etched conventionally resulting in an array of circuit traces or paths terminating in conductive pads on an edge of the film substrate. In the process of the invention, the conductive pads are connected to a corresponding or mating set of connecting pads on a separate flexible substrate. The conductive pads leads or traces are precoated with solder. Such a precoating step can be accomplished conventionally by either electroplating solder or heat coating solder on the conductive pads. In an alternative embodiment, the conductive leads of one of the flexible circuits creating the lap joint is not precoated with solder whereby the amount of solder on the other flexible circuit is sufficient to create the mechanical and electrical bonds when the joint is inductively heated.

Once the copper layer is masked and etched the adhesive is exposed. Sufficient adhesive is used to ensure a competent bond that obtains mechanical security between the circuit layers. The adhesive is exposed in a pattern around the conductive pads. On each flexible circuit, the resulting structure comprises an edge containing an array of conductor pads with the exposed adhesive between the pads. The pads on one flexible substrate comprise a bonding area that corresponds to the conductor pads and adhesive (if any) on the flexible circuit of the second flexible substrate. In such a way, the pads have limited corresponding areas for electrical and mechanical joinery resulting in a mechanically and electrically competent bond. One substantial advantage of the invention involves the ability to form such a bond between layers without additional electrical or mechanical connectors.

The relatively small corresponding bonding areas on each flexible substrate are then brought in to an overlapping position such that each electrical contact pad comes into direct physical contact with a corresponding electrically competent pad on the opposite flexible substrate. In such an orientation, the adhesive also comes into an appropriate position between leads and between the two flexible substrates. A radio frequency heater means is used to heat solder on the corresponding bonding pads resulting in electrically and mechanically bonded competent joint. A radio frequency heating unit is selected such that the radio frequency field is limited to the overlapping areas of corresponding solder pads. Since heat is unnecessary outside the area of solder, the preferred mode involves limiting the radio frequency heating to the specific overlapping areas thus avoiding heating other areas of the circuits. In forming the solder bonded mechanical and electrical joint, the overlapping areas are held in place under pressure using flexible platens made of material that do not heat under the radio frequency conditions. A thin, flexible sheet such as Teflon® is useful since it conforms to the circuit structures but do not heat in the presence of radio frequency energy.

Preferably, the radio frequency energy has a frequency that ranges from about 1 to 15 mHz, power output of about 1 to 3 kilowatts, creates a temperature in the solder mass of about 220–260° C., and is applied for a period of time of less than 5 seconds. The amount of time necessary to reflow the solder is inversely related to the size of the contact pads. Such heating cycle melts solder on both corresponding areas and permits the solder to form an electrically competent solder joint between contact pads. During the solder heating step, the joining area is subject to a pressure normal to the surface of the circuits of about 0 to 15 psi. Such pressure may be applied by a vacuum table with a Teflon® sheet over top such that intimate contact of conductor to conductor is maintained without inducing excess pressure that could lead to solder squeeze out.

One radio frequency heater means applicable to use in this invention is a small induction soldering machine such as Model 1TM HF, made by Seit Electronica, in Italy. The U.S. distributor of the machine is RDO Enterprises, Newark, N.J. The machine magnetically induces eddy currents in copper conductors of sufficient power to heat the conductors to soldering temperatures (220–260° C.). The inductor consists of a single, rectangular loop of copper tubing. High frequency (440–1100 kHz) AC current is supplied to the loop, and the varying magnetic field induces current flow in adjacent conductive material. Cooling water at 60–100 psi is pumped through the loop tubing to prevent overheating.

For a lap joint created with copper leads having a 0.060" contact width and 0.050" spacing, the inductor loop is held 0.040" from the substrate and is activated for about 0.60 seconds to cause the solder to reflow and bond at the contact pads.

After the electrical contact pads are bonded via the inductive heating unit, pressure and/or heat is applied to cause the adhesive surrounding the leads to mechanically join the substrates in the adjoining area. Such heat and pressure to cause the adhesive to bond may be applied by an impulse sealer or a nip roller. The amount of heat and pressure necessary to cause the mechanical bond is dependent on the thickness of the adhesive and the thickness of the copper leads. More pressure is necessary to form an adhesive envelope around thicker leads. The heat necessary to bond the adhesive is sufficiently less than that necessary to reflow the solder whereby direct heat to the polyester substrate will not impair its integrity.

The present invention is believed to be applicable to a variety of arrangements for electrically connecting printed circuit boards one to another, and believed to be particularly applicable to connecting flexible printed circuit boards whose substrates have a relatively low tolerance to heat. While the present invention is not limited to such applications, an appreciation of various aspects of the invention will be gained through a discussion of various example embodiments provided below.

DETAILED DISCUSSION OF THE FIGURES

Figure 1:
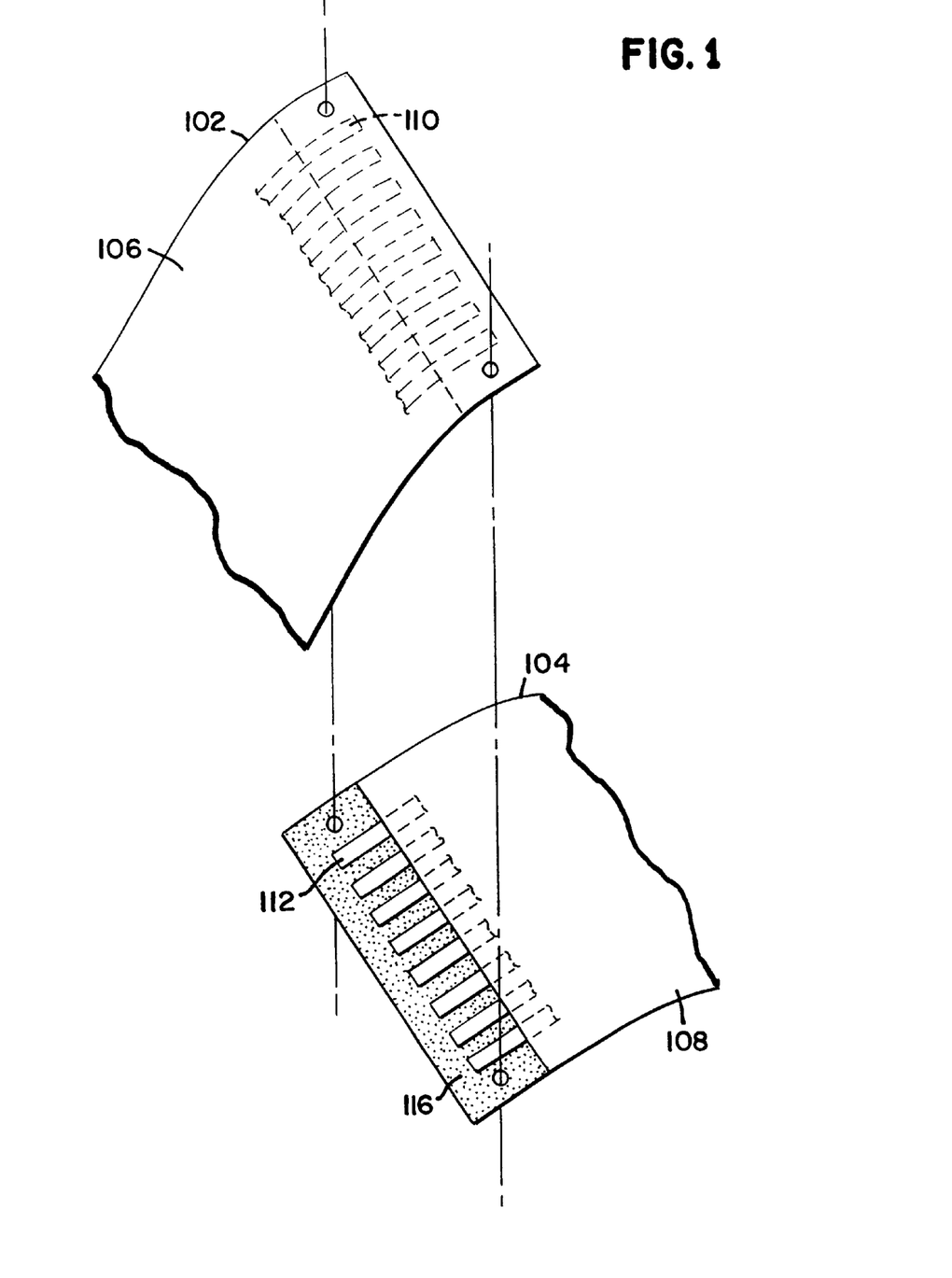
FIG. 1 is a pictorial view of two flexible printed circuit boards which are arranged to be electrically connected.

FIG. 1 is a pictorial view of two flexible printed circuit boards 102 and 104 arranged to be electrically connected. Each of the boards has a substrate surface 106 and a laminated surface 108. Board 102 is shown with its substrate surface 106 exposed, and board 104 is shown with its laminated surface 108 exposed. When boards 104 and 102 are electrically connected the laminated surface of 108 of board 104 faces the laminated surface of board 102.

The boards 102 and 104 also include respective pluralities of solder covered copper leads 110 and 112. The leads 110 of board 102 are arranged to be electrically connected with the leads 112 of board 104, respectively. The leads 110 and 112 are respectively connected to additional circuitry (not shown) disposed between the laminated surfaces and substrates of boards 102 and 104. Bonding of the leads 112, for example, to the substrate of board 104 is accomplished with a thermoplastic adhesive. Adhesive is also present between leads 112 as shown by shaded area. It will be recognized that board 102 is similarly constructed.

In an example embodiment, boards 102 and 104 are flexible printed circuit boards constructed with a polyester substrate. Key advantages of polyester include its flexibility, weight, and cost. However, a disadvantage is its relatively low tolerance to heat. An example embodiment of the method of the invention uses inductive heating to solder the leads 110 of board 102 to leads 112 of board 104. The controlled heat generated by induction soldering will not damage the polyester substrate provided that the heating is of limited duration. After heating and soldering the leads 110 and 112 by induction soldering, heat and pressure applied to the boards 102 and 104 causes the adhesive 116 and the adhesive (not shown) between the leads 110 of board 102 to melt. The melted adhesive of the two boards 102 and 104 bonds together to form a seal between adjacent leads on boards 102 and 104. The bonded adhesive serves to further electrically insulate the adjacent leads and mechanically strengthen the lap-joint that connects boards 102 and 104.

Figure 2:
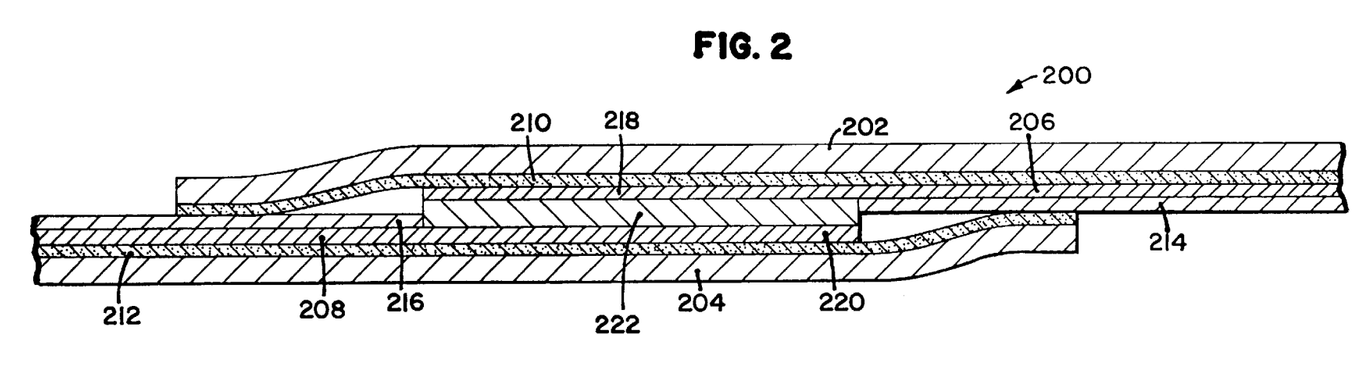
FIG. 2 is a cross-sectional view of a typical lap joint.

Turning now to FIG. 2, a cross-sectional view of a lap-joint 200 along the longitudinal axis of electrically connected leads 110 and 112 is shown in accordance with an example embodiment of the invention. Each of the boards includes respective substrates 202 and 204, conductive layers 206 and 208 bonded to the substrate with thermoplastic adhesive layers 210 and 212, and laminate layers 214 and 216 covering the conductive layers up to the portion the conductive layer forms leads 218 and 220. The leads 218 and 220 are covered with eutectic solder layers prior to inductive soldering. After inductive soldering, the solder layers reflow to form solder portion 222 of the lap-joint 200.

It will be appreciated that the adhesive layers 210 and 212 not only bond to each other (see FIG. 3) between the leads, but also bond to the laminate portions 216 and 214 of the opposing board. Specifically, adhesive layer 210 is bonded to laminate layer 216, and adhesive layer 212 is bonded to laminate layer 214. This additional bonding helps to seal the lap-joint 200 from moisture and oxidation.

Figure 3:
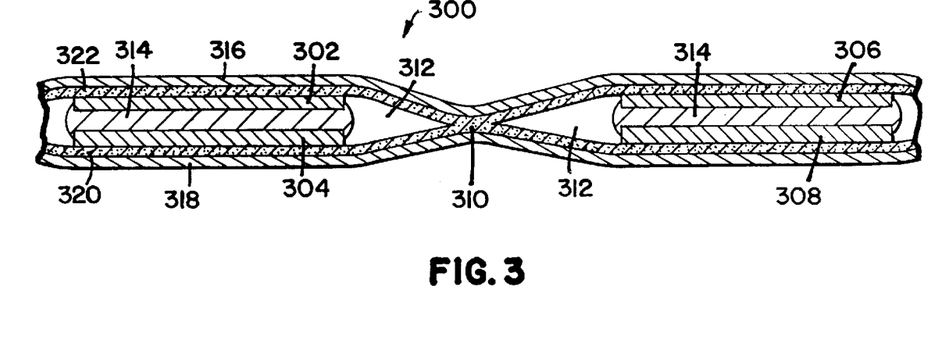
FIG. 3 is a partial cross-sectional view of a lap joint which illustrates the adhesive seal formed between each pair of conducting leads.

FIG. 3 is a partial cross-sectional view of a lap-joint 300 along the latitudinal axis of two pairs of soldered leads in accordance with an example embodiment. This cross-sectional view, as compared to the view of FIG. 2, illustrates the adhesive seal 310 that is formed between connected pairs of leads 302 and 304 and 306 and 308. The seal 310 strengthens the lap-joint and protects against short circuits between the connected pairs of leads. This figure also shows the reformed solder portion 314, along with the respective substrates 316 and 318 and the adhesive layers 320 and 322.

In one aspect of the invention, the same adhesive layer that is used to bond the conductor to the substrate is used to enhance the strength of the lap-joint. Manufacturing costs are saved because no extra material is required to seal the lap-joint. In another example embodiment, extra adhesive could be deposited between the leads if more adhesive is needed to form a seal between gaps 312. Thicker copper leads may require more adhesive.

In another example embodiment, environmental conditions or circuit design may deem that the adhesive bonding step following the induction soldering step may not be necessary to create a functional joint.

Figure 4:
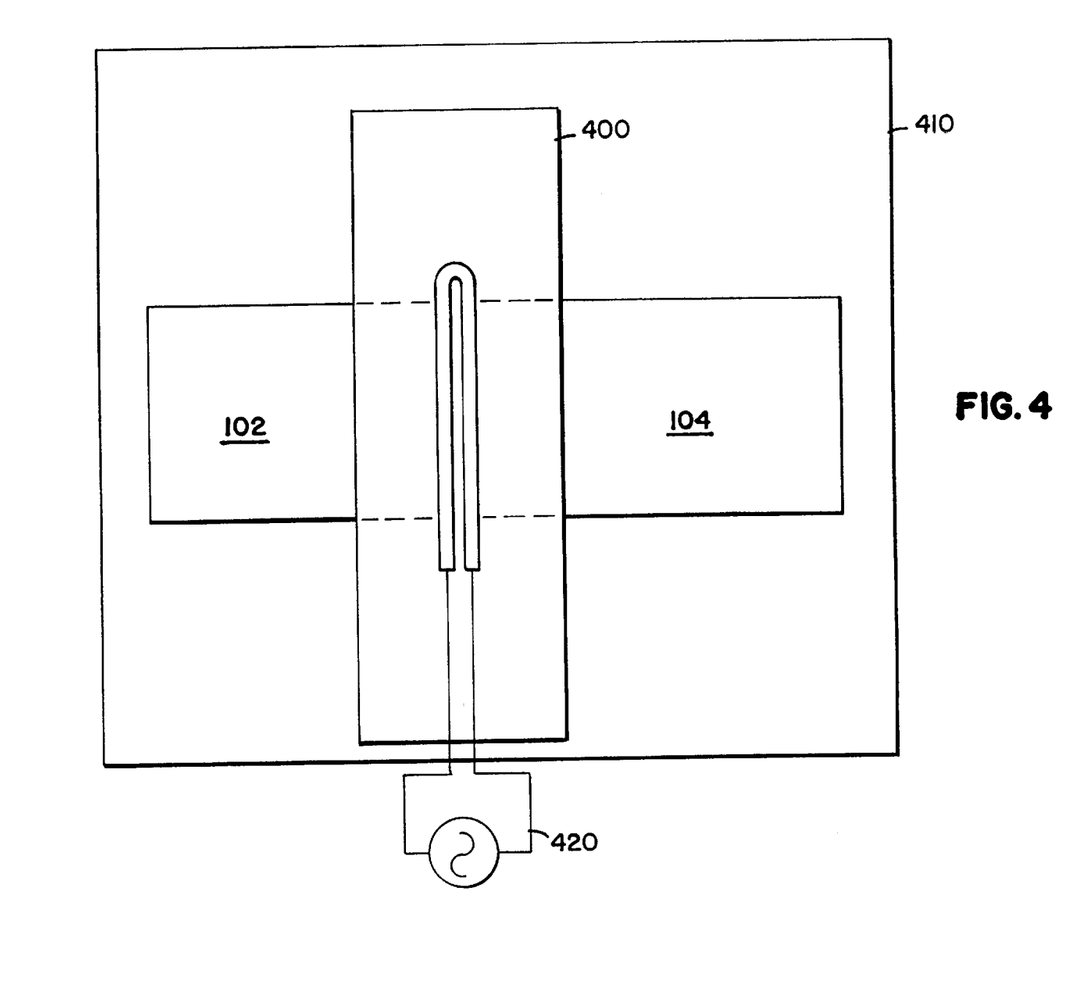
FIG. 4 shows an arrangement for inductively soldering a lap joint formed by two flexible printed circuit boards or cables.

FIG. 4 is a diagram that shows an arrangement for inductively soldering a lap-joint formed by two flexible printed circuit boards 102 and 104. The soldering takes place on a vacuum table 410, and involves placing a sheet 400 of TEFLON® over the lap-joint during soldering. The induction coil assembly 421 is also seen. The heater 420 directs the induction coil assembly 421 toward the heated bonding areas 422 such that it heats only the areas under coil.

Figure 5:
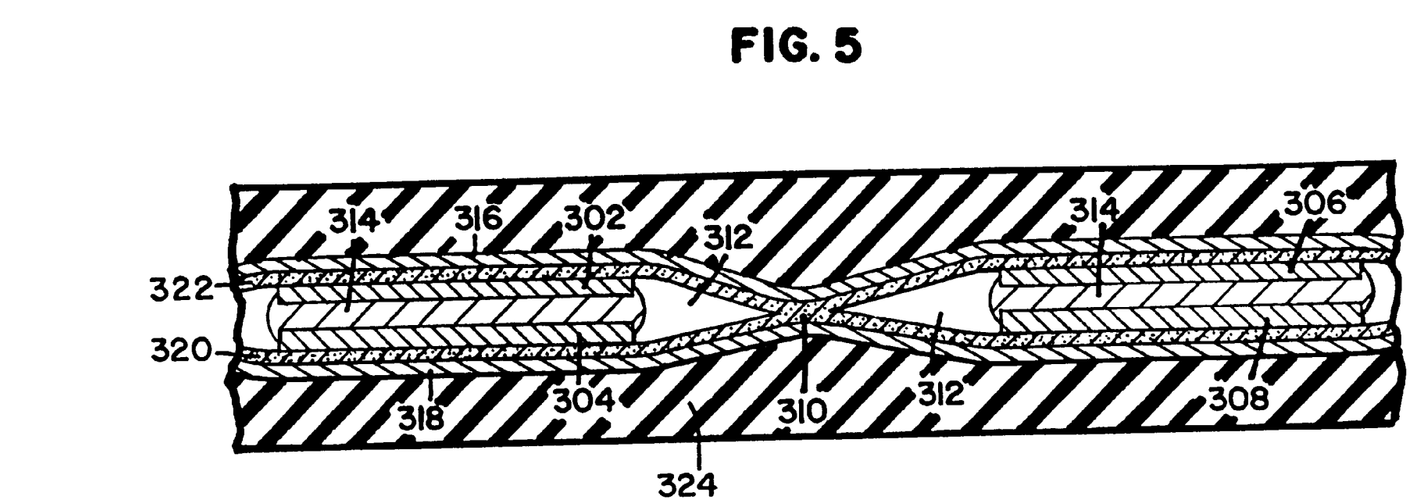
FIG. 5 shows the heated rubber pads used to press the flexible printed circuit boards into the desired shape in order to form the adhesive seals between each pair of conducting leads.

FIG. 5 is a modified version of FIG. 3, showing the heat-resistant rubber pads 324 which are used to press the flexible boards into desired shapes after the induction soldering in order to cause the adhesive layers to contact and bond. It shows the same components as FIG. 3, aside from the addition of the rubber pads 324. The flexible boards resist the heat of the rubber pads because the heat needed to join the adhesive is much less than that needed to solder the joint.

The various embodiments described above are provided by way of illustration only and should not be construed to limit the invention. Those skilled in the art will readily recognize various modifications and changes that may be made to the present invention without strictly following the example embodiment and applications illustrated and described herein, and without departing from the true spirit and scope of this invention, which is set forth in the following claims.

I claim:

1. An assembly of electrically connected printed circuit boards, comprising:

a first printed circuit board including a substrate and an electrically conductive layer bonded to the substrate with an insulating adhesive, the conductive layer having a first plurality of solder covered electrically conductive leads disposed on the substrate with adhesive present between the first plurality of electrically conductive leads;

a second printed circuit board including a substrate and an electrically conductive layer bonded to the substrate with an insulating adhesive, the conductive layer bonded to the substrate with an insulating adhesive, the conductive layer having a second plurality of solder covered electrically conductive leads disposed on the substrate with adhesive present between the second plurality of electrically conductive leads; and wherein inductive heat applied to the solder covered leads causes the first plurality of leads to be electrically and mechanically connected to the second plurality of leads, and an adhesive bond is formed between the adhesive between the first plurality of leads and the adhesive between the second plurality of leads thereby insulating the electrically connected leads from one another.

2. The article of claim 1 wherein the adhesives of the first and second boards are thermally activated adhesives.

3. The article of claim 1 wherein the substrate of the first board is rigid and the substrate of the second board is flexible.

4. The article of claim 1 wherein the substrate of the first board is flexible and the substrate of the second board is flexible.

5. The article of claim 1 wherein the substrate of the first board is polyester film.

6. The article of claim 5 wherein the substrate of the second board is polyester film.

7. The article of claim 5 wherein the polyester film is between about 20 and 175 microns thick.

8. The article of claim 7 wherein the adhesive is between about 10 and 75 microns thick.

9. The article of claim 1 wherein the substrate of the first board is polyester film and the substrate of the second board is polyimide film.

10. The article of claim 1 wherein the second plurality of leads is not covered by solder.

11. The article of claim 1 wherein the copper layer is between about 20 and 200 microns thick.

12. Claim 1 wherein the circuit is a printed circuit.

13. An assembly of electrically connected leads, comprising:

a first circuit board including a substrate and an electrically conductive layer bonded to the substrate with an insulating adhesive, the conductive layer having a first plurality of solder covered electrically conductive leads disposed on the substrate with adhesive present between the first plurality of electrically conductive leads;

a second component including an insulative support and a second plurality of electrically conductive leads on the support;

a coating of solder on one of said first plurality of leads and said second plurality of leads;

wherein inductive heat applied to one of said first plurality of leads and said second plurality of leads causes the first plurality of leads to be electrically and mechanically connected to the second plurality of leads, and an adhesive bond is formed between the adhesive between the first plurality of leads and the area between the second plurality of leads thereby insulating the electrically connected leads from one another.

14. An assembly of electrically connected circuit boards, comprising:

a first circuit board including a substrate and a first plurality of electrical conductors bonded to the substrate with an insulating adhesive, said first plurality of conductors terminating at a first plurality of leads defining a first plurality of sections of said first substrate between said first plurality of leads;

a second circuit board including a substrate and a second plurality of electrical conductors bonded to the substrate with an insulating adhesive, said second plurality of conductors terminating at a second plurality of leads defining a second plurality of sections of said second substrate between said second plurality of leads;

a layer of solder disposed on one of said first plurality of leads and said second plurality of leads;

wherein inductive heat applied to one of said first plurality of leads and said second plurality of leads causes the first plurality of leads to be electrically and mechanically connected to the second plurality of leads, and a bond is formed between said first plurality of sections of the first substrate and said second plurality of sections of the second substrate.

* * * * *